(12) United States Patent
Kim et al.

(10) Patent No.: US 12,288,781 B2
(45) Date of Patent: Apr. 29, 2025

(54) PSPI-BASED PATTERNING METHOD FOR RDL

(71) Applicant: STATS ChipPAC Pte. Ltd., Singapore (SG)

(72) Inventors: ChangOh Kim, Incheon (KR); JinHee Jung, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 90 days.

(21) Appl. No.: 18/355,906

(22) Filed: Jul. 20, 2023

(65) Prior Publication Data

US 2023/0361103 A1 Nov. 9, 2023

Related U.S. Application Data

(62) Division of application No. 17/343,402, filed on Jun. 9, 2021, now Pat. No. 11,749,668.

(51) Int. Cl.
| | | |
|---|---|---|
| *A61B 5/02* | (2006.01) | |
| *H01L 21/56* | (2006.01) | |
| *H01L 21/78* | (2006.01) | |
| *H01L 23/552* | (2006.01) | |
| *H01L 25/00* | (2006.01) | |
| *H01L 25/065* | (2023.01) | |

(52) U.S. Cl.
CPC .............. *H01L 25/50* (2013.01); *H01L 21/56* (2013.01); *H01L 21/78* (2013.01); *H01L 23/552* (2013.01); *H01L 25/0652* (2013.01); *H01L 2225/06524* (2013.01)

(58) Field of Classification Search
CPC ......... H01L 25/50; H01L 21/56; H01L 21/78; H01L 23/552
See application file for complete search history.

(56) References Cited

U.S. PATENT DOCUMENTS

| | | | |
|---|---|---|---|
| 7,633,765 B1 | 12/2009 | Scanlan et al. | |
| 8,193,034 B2 | 6/2012 | Pagaila et al. | |
| 8,283,205 B2 | 10/2012 | Pagaila et al. | |
| 9,391,021 B2 | 7/2016 | Lin et al. | |
| 9,449,943 B2* | 9/2016 | Lin | H01L 21/568 |
| 10,217,637 B1 | 2/2019 | Budd et al. | |
| 10,418,298 B2* | 9/2019 | Lin | H01L 23/3135 |
| 11,973,023 B2* | 4/2024 | Wang | H01L 21/561 |

(Continued)

FOREIGN PATENT DOCUMENTS

| | | |
|---|---|---|
| CN | 103794587 A | 5/2014 |
| CN | 110660686 A | 1/2020 |

(Continued)

*Primary Examiner* — Thao P Le
(74) *Attorney, Agent, or Firm* — Brian M. Kaufman; Robert D. Atkins; Atkins and Associates, P.C.

(57) ABSTRACT

A semiconductor device is formed by providing a semiconductor package including a shielding layer and forming a slot in the shielding layer using a laser. The laser is turned on and exposed to the shielding layer with a center of the laser disposed over a first point of the shielding layer. The laser is moved in a loop while the laser remains on and exposed to the shielding layer. Exposure of the laser to the shielding layer is stopped when the center of the laser is disposed over a second point of the shielding layer. A distance between the first point and the second point is approximately equal to a radius of the laser.

21 Claims, 15 Drawing Sheets

(56) References Cited

U.S. PATENT DOCUMENTS

| | | |
|---|---|---|
| 2012/0018897 A1 | 1/2012 | Park et al. |
| 2013/0099358 A1* | 4/2013 | Elolampi ............. H05K 1/0346 |
| | | 257/618 |
| 2016/0118372 A1 | 4/2016 | Lin et al. |
| 2018/0102313 A1 | 4/2018 | Shih |
| 2020/0006240 A1 | 1/2020 | Kuo et al. |
| 2020/0105656 A1 | 4/2020 | Shibata et al. |
| 2020/0294901 A1 | 9/2020 | Strong et al. |
| 2021/0366823 A1 | 11/2021 | Bouche et al. |
| 2022/0328443 A1 | 10/2022 | Chen et al. |
| 2022/0359321 A1* | 11/2022 | Jung ..................... H01L 25/105 |
| 2022/0359418 A1* | 11/2022 | Jung ................... H01L 23/5386 |
| 2022/0399323 A1* | 12/2022 | Kim ...................... H01L 23/552 |
| 2023/0050785 A1* | 2/2023 | Yeh ..................... H01L 21/6835 |

FOREIGN PATENT DOCUMENTS

| | | |
|---|---|---|
| CN | 111146170 A | 5/2020 |
| CN | 211208425 U | 8/2020 |

\* cited by examiner

PSPI-BASED PATTERNING METHOD FOR RDL

CLAIM OF DOMESTIC PRIORITY

The present application is a division of U.S. patent application Ser. No. 17/343,402, now U.S. Pat. No. 11,749,668, filed Jun. 9, 2021, which application is incorporated herein by reference.

FIELD OF THE INVENTION

The present invention relates in general to semiconductor devices and, more particularly, to a semiconductor device and method of RDL patterning using photosensitive polyimide (PSPI).

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor packages are commonly formed with redistribution layers (RDL) that connect to terminals on a semiconductor die or other component and redistribute the terminals into a different footprint or pattern. One key to making smaller devices is to reduce RDL size. As electronic devices get smaller and incorporate more functionality, the devices have to accommodate a high density of components in a limited area. A higher density of components requires a smaller sized RDL.

Laser patterning is technically capable of forming the small features required for today's high component densities, but the expense of equipment required to minimize laser beam diameter is becoming prohibitive as features become smaller. In addition, laser patterning creates a risk of damaging the surface underlying the patterned layer and can also damage underlying semiconductor components. Therefore, a need exists for improved patterning methods for RDL formation.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contacts within the package. The electrical connections can be made with conductive layers, bumps, stud bumps, conductive paste, or bond wires. An encapsulant or other molding material is deposited over the package to provide physical support and electrical isolation. The finished package is then inserted into an electrical system and the functionality of the semiconductor device is made available to the other system components.

Figure 1A:
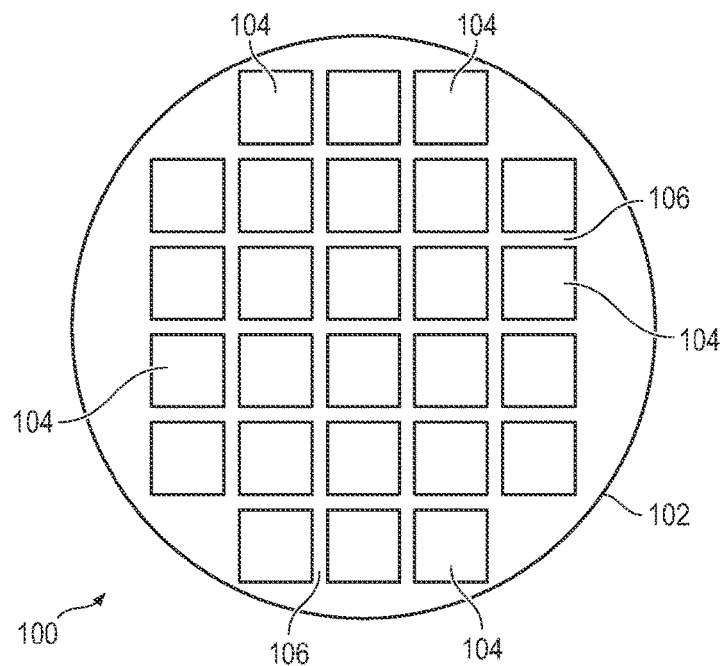
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
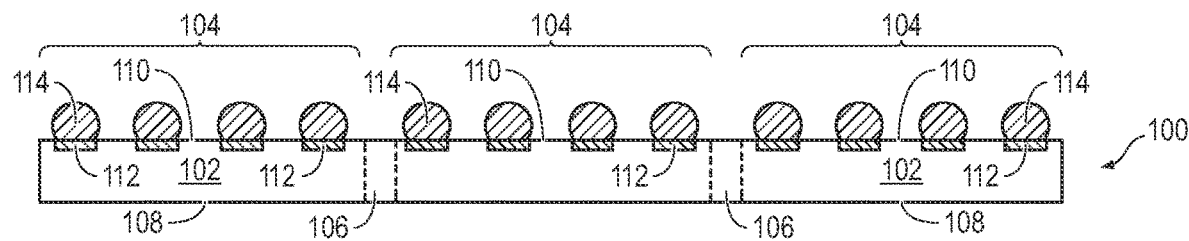

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), power amplifier, application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, combinations thereof, or other suitable conductive materials with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
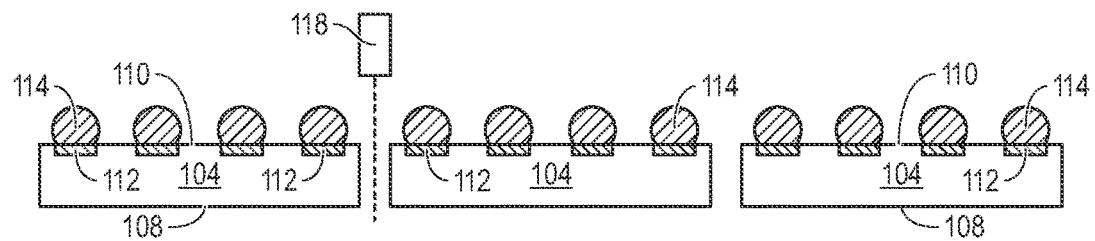

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation.

Figure 2A:
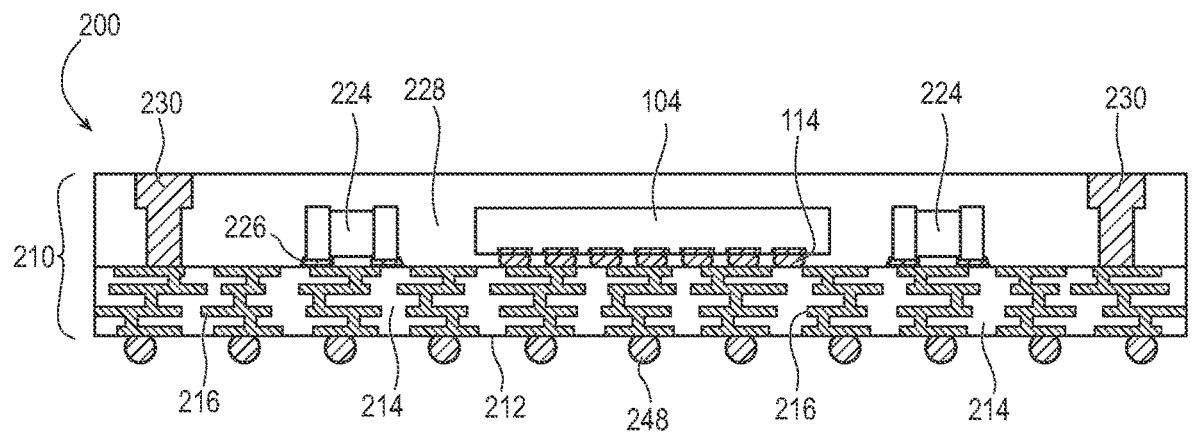
FIGS. 2a-2l illustrate using photosensitive polyimide in manufacturing redistribution layers.
Figure 2B:
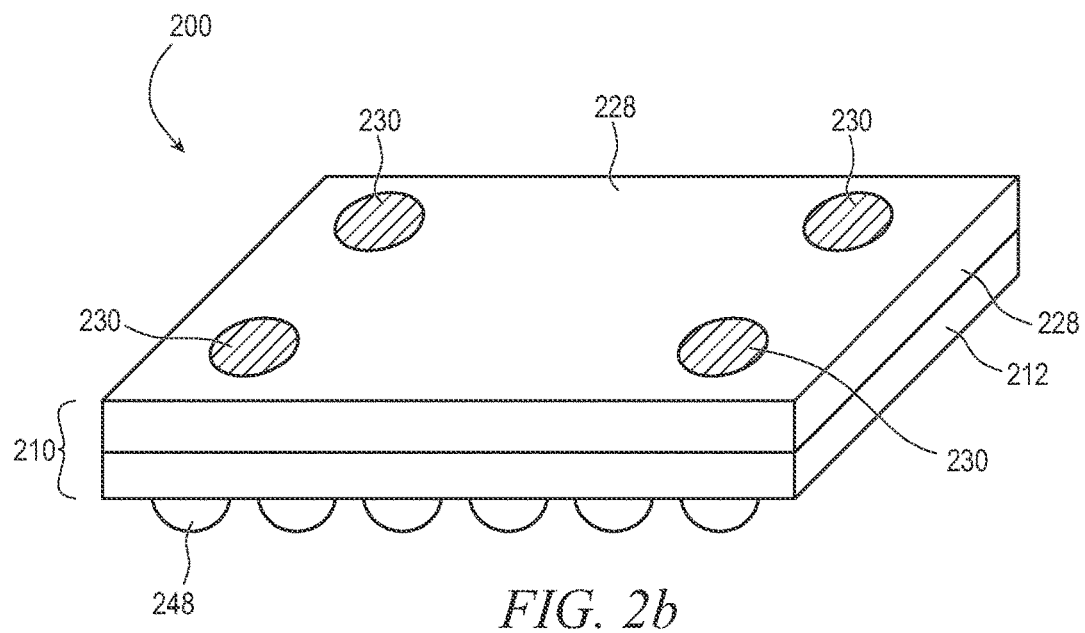

FIGS. 2a-2l illustrate a process of forming a redistribution layer (RDL) on a semiconductor package using photosensitive polyimide (PSPI). FIGS. 2a and 2b illustrate an exemplary semiconductor package 200 being formed with semiconductor die 104. Package 200 is typically formed as a large panel of multiple packages connected together, of which FIGS. 2a and 2b show only a single one. FIGS. 2a and 2b show semiconductor package 200 in an intermediate formation step wherein a first layer 210 of the package has been completed. FIG. 2a is a partial cross-section showing only one unit of the panel, and FIG. 2b is a perspective view of the same one unit.

Substrate 212 is provided as a panel large enough to form the desired number of packages together. Substrate 212 includes one or more insulating layers 214 interleaved with one or more conductive layers 216. Insulating layer 214 is a core insulating board in one embodiment, with conductive layers 216 patterned over the top and bottom surfaces, e.g., a copper-clad laminate substrate. Conductive layers 216 also include conductive vias electrically coupled through insulating layers 214 for vertical interconnect.

Substrate 212 can include any number of conductive layers 216 and insulating layers 214 interleaved over each other. A solder mask or passivation layer can be formed over either side or both sides of substrate 212. Openings are formed in the passivation layer to expose contact pads of conductive layer 216 for subsequent interconnection. Any suitable type of substrate or leadframe is used for substrate 212 in other embodiments. Typically, first layer 210 is formed on substrate 212 as a panel or strip large enough to form several to hundreds or thousands of packages at one time. First layer 210 can be singulated from the strip once completed, or packages 200 are singulated into individual packages after completion of all desired layers.

Any components desired for the functionality of first layer 210 are mounted on or disposed over substrate 212 and electrically connected to conductive layers 216 using solder, solder paste, bond wires, or another suitable interconnect structure. FIG. 2a illustrates semiconductor die 104 mounted on substrate 212 along with discrete electrical components 224. Discrete electrical components 224 can be passive components such as capacitors, resistors, or inductors, active components such as diodes or transistors, or any other desired electrical component.

Multiple semiconductor die can be disposed on substrate 212. Semiconductor die 104 can be provided as part of a smaller sub-package rather than a bare die. Any desired electrical component can be mounted on substrate 212, such as passive devices, semiconductor die, wafer-level chip-scale packages (WLCSP), or system-in-package (SiP) modules. The mounted components can have EMI shielding layers formed over the individual components in addition to shielding that may be provided as part of forming semiconductor package 200.

Semiconductor die 104 is mounted to substrate 212 by disposing the semiconductor die on the substrate using, e.g., a pick-and-place process or machine, and then reflowing bumps 114 to physically and electrically connect the bumps to exposed contact pads of conductive layer 216. Discrete components 224 are connected by similar solder bumps or solder paste 226. Solder paste 226 can be printed onto substrate 212 or discrete components 224 prior to picking and placing the discrete components onto the substrate. Reflowing solder paste 226 physically and electrically couples discrete components 224 to contact pads of conductive layer 216.

After mounting of semiconductor die 104, discrete components 224, and any other desired electrical components onto substrate 212, the components are encapsulated by encapsulant or molding compound 228. Encapsulant 228 is deposited over substrate 212, semiconductor die 104, and discrete components 224 using paste printing, compressive molding, transfer molding, liquid encapsulant molding, vacuum lamination, spin coating, or another suitable applicator. Encapsulant 228 can be polymer composite material, such as epoxy resin, epoxy acrylate, or polymer with or without a filler. Encapsulant 228 is non-conductive, provides structural support, and environmentally protects the semiconductor device from external elements and contaminants.

Openings are formed through encapsulant 228 to expose contact pads of conductive layers 216. The openings are filled with a conductive material using any suitable metal deposition technique to form conductive vias 230. The openings for conductive vias 230 can be formed by mechanical drilling, chemical etching, laser drilling, or any other suitable process. The conductive material can be Al, Cu, Sn, Ni, Au, Ag, or other suitable electrically conductive material. Conductive vias 230 provide vertical interconnect between first layer 210 and subsequently formed layers of semiconductor package 200.

In other embodiments, conductive vias 230 are formed or disposed on substrate 212 as conductive pillars, solder bumps, copper-clad solder bumps (CCSB), PCB units, modular interconnect units, or any other suitable interconnect structure prior to deposition of encapsulant 228. When conductive vias 230 are formed prior to deposition of encapsulant 228, the encapsulant may undergo a backgrinding, laser drilling, or other suitable process to expose the conductive vias if necessary.

Bumps 248 are formed on the bottom surface of substrate 212 at any stage in the manufacturing process. Bumps 248 are similar to and formed in a similar manner to bumps 114 on semiconductor die 104. While one specific package type is shown for first layer 210, the first layer can be formed in any suitable package type, such as an embedded wafer-level ball-grid array (eWLB) or a double-sided SiP module where both sides of substrate 212 have encapsulated components.

Figure 2C:
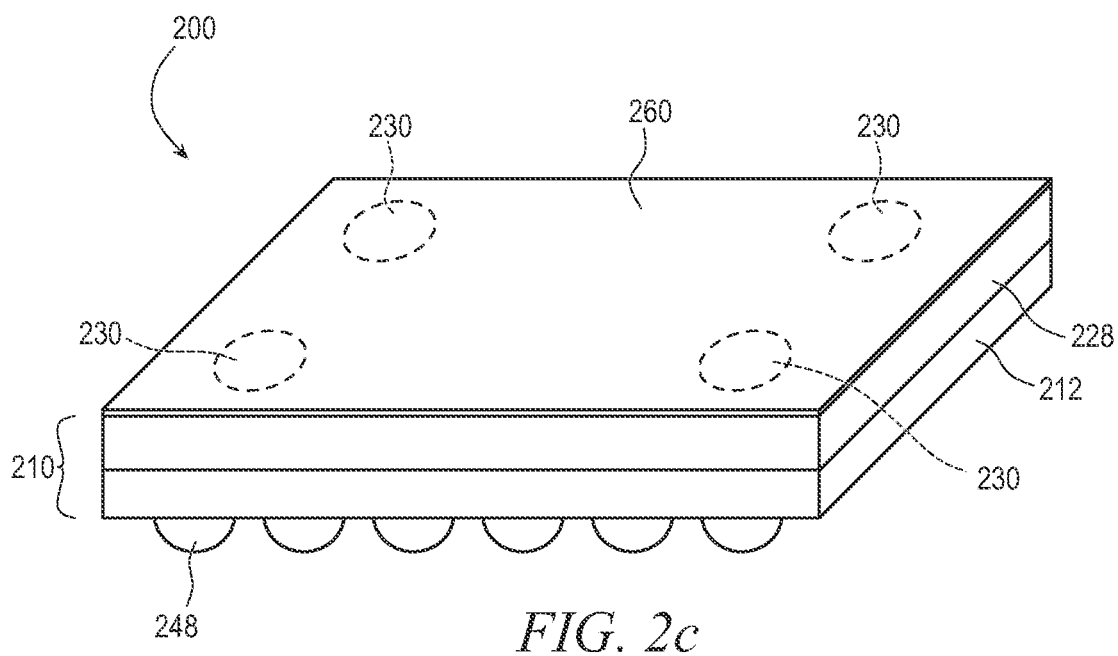

To continue forming additional package layers over first layer 210, an RDL is formed over encapsulant 228 and connected to the first layer by conductive vias 230. FIG. 2c shows a first step in the RDL formation process for a second package layer 250. A PSPI layer 260 is formed over first layer 210. PSPI layer 260 comprises a photosensitive polyimide. In one embodiment, PSPI is spin-coated onto the first layer 210 panel and then cured. Alternatively, PSPI can be deposited in liquid form using any other suitable method or disposed over first layer 210 as a preformed sheet. PSPI layer 260 completely covers and physically contacts the top surfaces of conductive vias 230 and encapsulant 228 across all of the packages being formed in the panel.

Figure 2D:
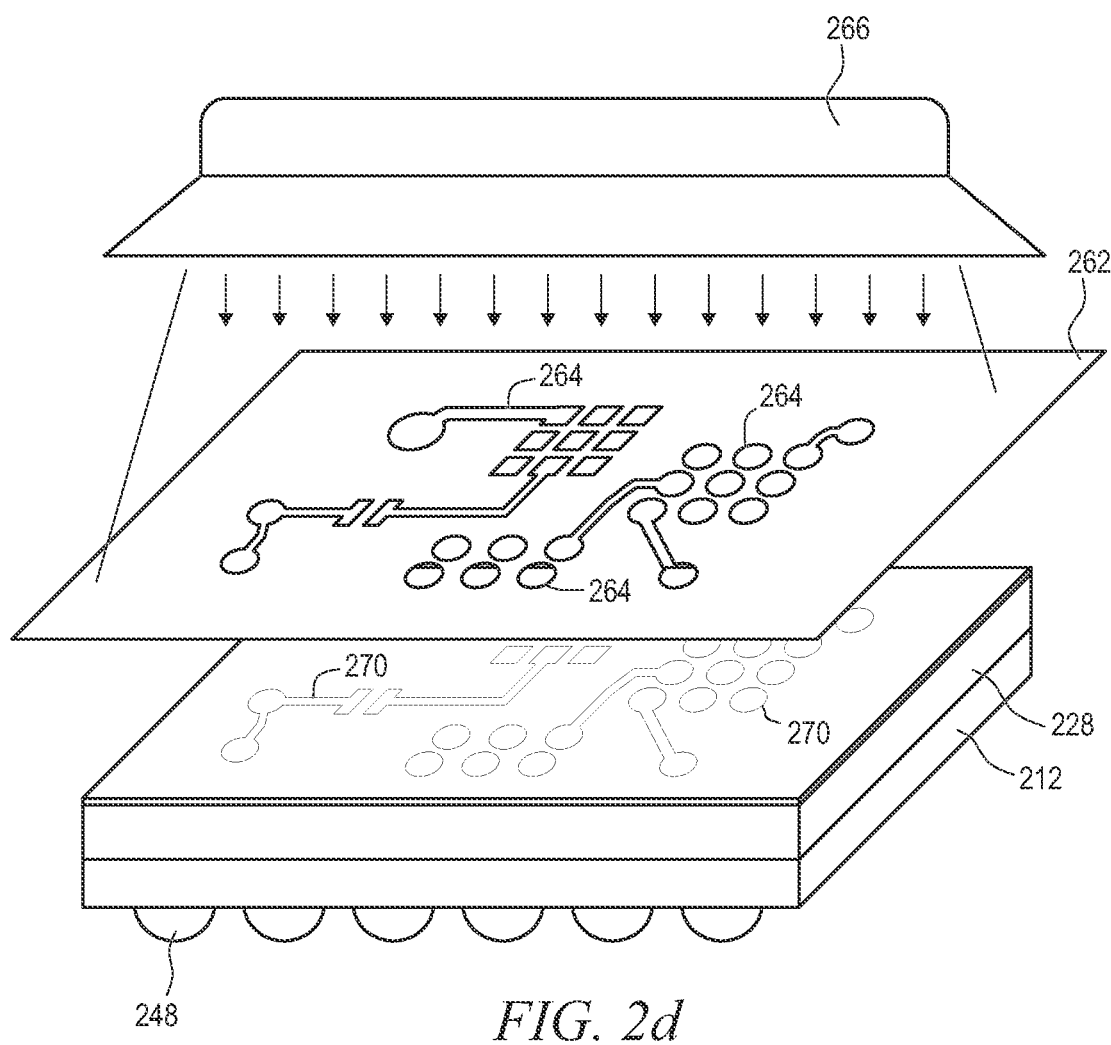

PSPI layer 260 is used as a photolithography resist layer. To make an RDL using PSPI layer 260, the PSPI layer is irradiated through a mask 262 as shown in FIG. 2d. Mask 262 has a pattern 264 formed in the mask corresponding to a desired pattern for an RDL layer. Mask 262 usually includes the same pattern formed in the mask for each unit of the panel being manufactured, since all units being manufactured together are intended to be identical.

Radiation 266 is irradiated on PSPI layer 260 through mask 262. Mask 262 blocks radiation 266 except where pattern 264 is formed, which results in the radiation hitting PSPI layer in the same pattern as indicated by shadow pattern 270. Shadow pattern 270 shows the boundary between where radiation 266 hits PSPI layer 260 and where mask 262 blocks the radiation and casts a shadow. Radiation 266 hitting PSPI layer 260 causes a chemical change to the PSPI at the areas that are hit.

Figure 2E:
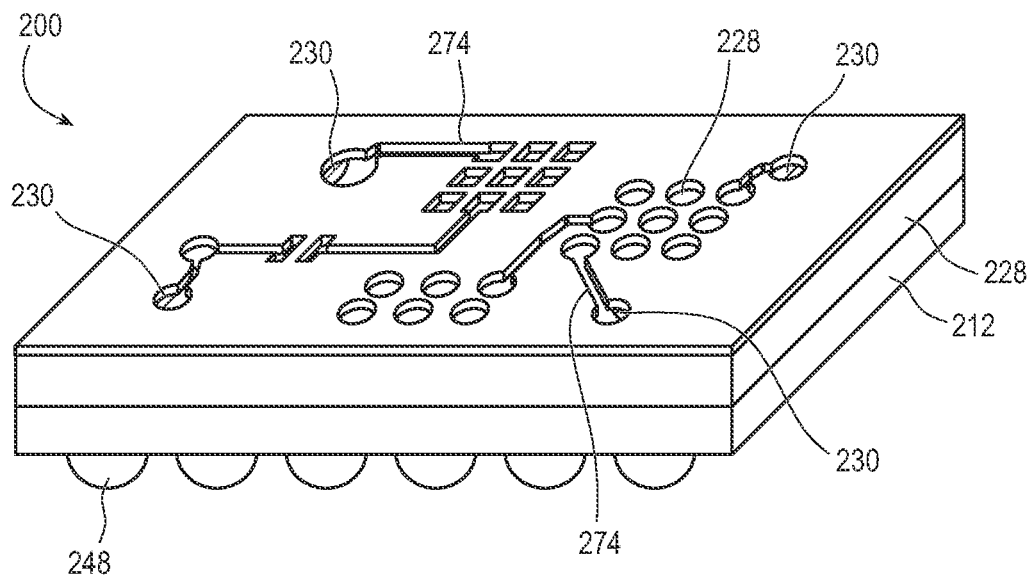

A chemical developer is then used to remove PSPI layer 260 only in the areas that were chemically changed by radiation 266 as shown in FIG. 2e. The chemical developer is typically a liquid that is spin coated onto PSPI layer 260 and reacts with the portions of the PSPI layer that were exposed to radiation 266, thereby removing PSPI in a pattern 274. The areas of PSPI layer 260 that were protected from radiation 266 by the shadow of mask 262 remain after development. Development of PSPI layer 260 results in pattern 274 that is nearly identical to the pattern 264 of mask 262. PSPI layer 260 is completely removed within pattern 274 such that encapsulant 228 and conductive vias 230 are exposed within the pattern.

Figure 2F:
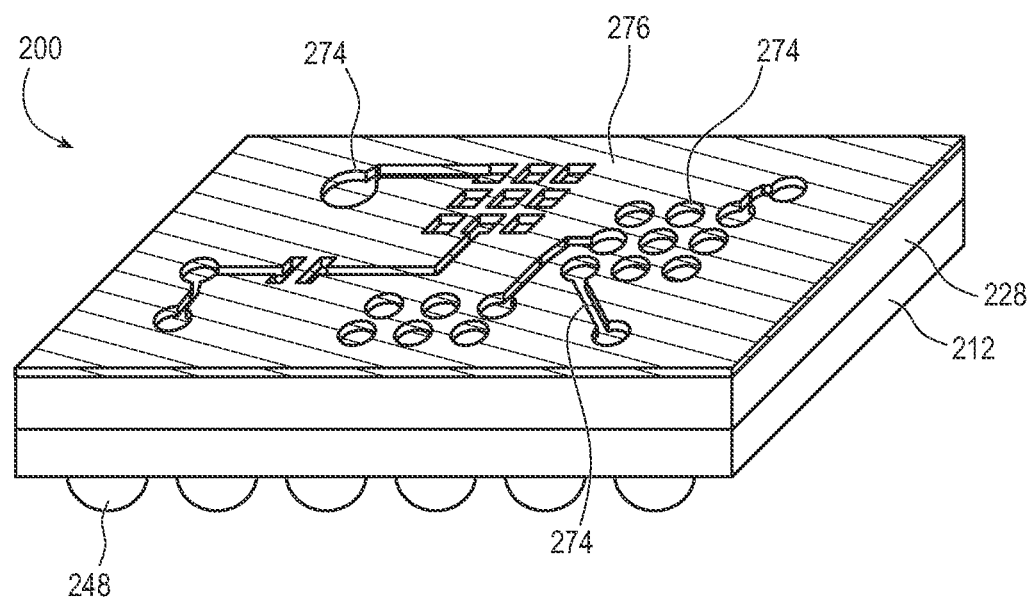

In FIG. 2f, a conductive material is sputtered over PSPI layer 260 with pattern 274 to form a conductive layer 276. Conductive layer 276 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material.

Conductive layer 276 completely covers PSPI layer 260. Conductive layer 276 also extends into pattern 274 to physically contact encapsulant 228 and conductive vias 230. Conductive layer 276 is a conformal layer, meaning that a uniform thickness of conductive material is deposited on all exposed surfaces. Conductive layer 276 is formed with approximately the same thickness of conductive material both on the top surface of PSPI layer 260, the side surfaces of the PSPI layers within pattern 274, and the exposed top surfaces of encapsulant 228 and conductive vias 230 within the pattern. In other embodiments, pattern 274 is completely filled with conductive material.

Conductive layer 276 is electrically connected to conductive layer 216 of substrate 212 through conductive vias 230. Conductive layer 276 is only formed over the top surface of first layer 210 because the first layer remains as an unsingulated panel. In other embodiments, first layer 210 can be singulated prior to formation of conductive layer 276 in order to form the conductive layer on side surfaces of each unit.

Figure 2G:
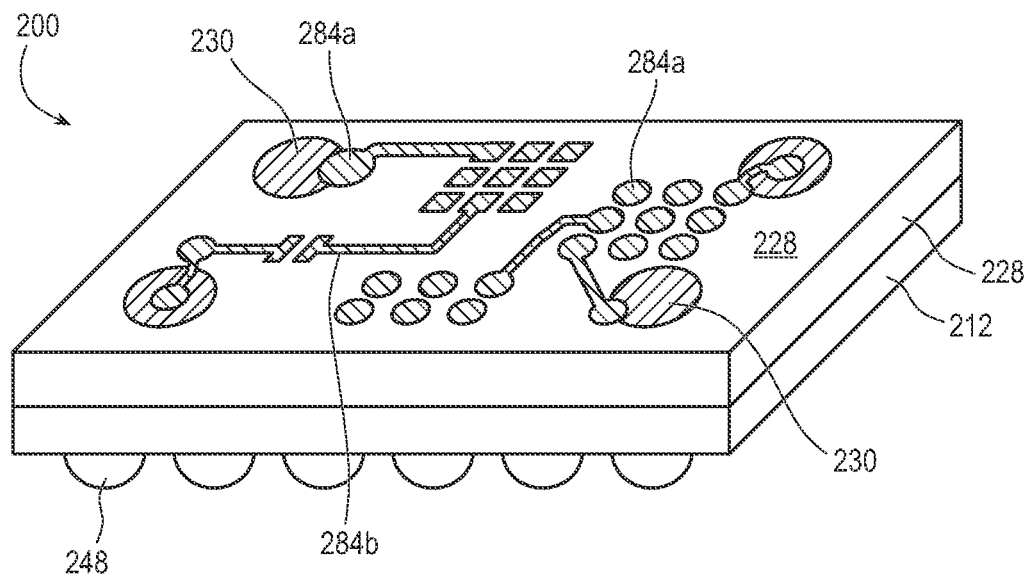

In FIG. 2g, PSPI layer 260 is removed along with the portions of conductive layer 276 that were formed on the PSPI layer. PSPI layer 260 is removed by dispensing a solvent over package 200. PSPI layer 260 is dissolved. The portions of conductive layer 276 that were formed on encapsulant 228 and conductive vias 230 within pattern 274 remain adhered to first layer 210, but the portions of the conductive layer that were adhered to PSPI layer 260 are removed with the dissolution of the PSPI layer. PSPI layer 260 can alternatively be peeled off, lifted off, or removed using any other suitable means.

Conductive layer 276 remains as conductive pattern 284 on top of first layer 210 as the beginning of second layer 250. Conductive pattern 284 is very similar to pattern 264 from mask 262 and pattern 274 that was formed in PSPI layer 260 using the mask. Conductive pattern 284 corresponds to a plurality of contact pads 284a, conductive traces 284b, and other conductive structures necessary to operate as an RDL for second package layer 250. Contact pads 284a are distributed as desired for connection to underlying vias 230, for subsequent mounting of semiconductor components, and for subsequent interconnect to overlying layers if additional layers are to be formed. Arrays of contact pads 284a remain for application of flip-chip or surface mount integrated circuits. A contact pad 284a pair is left for mounting of a discrete passive device. Contact pads 284a remain on conductive vias 230 to connect second layer 250 to the underlying components of first layer 210. Conductive traces 284b connect contact pads 284a to each other as necessary to implement the desired electrical functionality of package 200. In some embodiments, portions of conductive layer 276 are left to operate as EMI shielding.

Figure 2H:
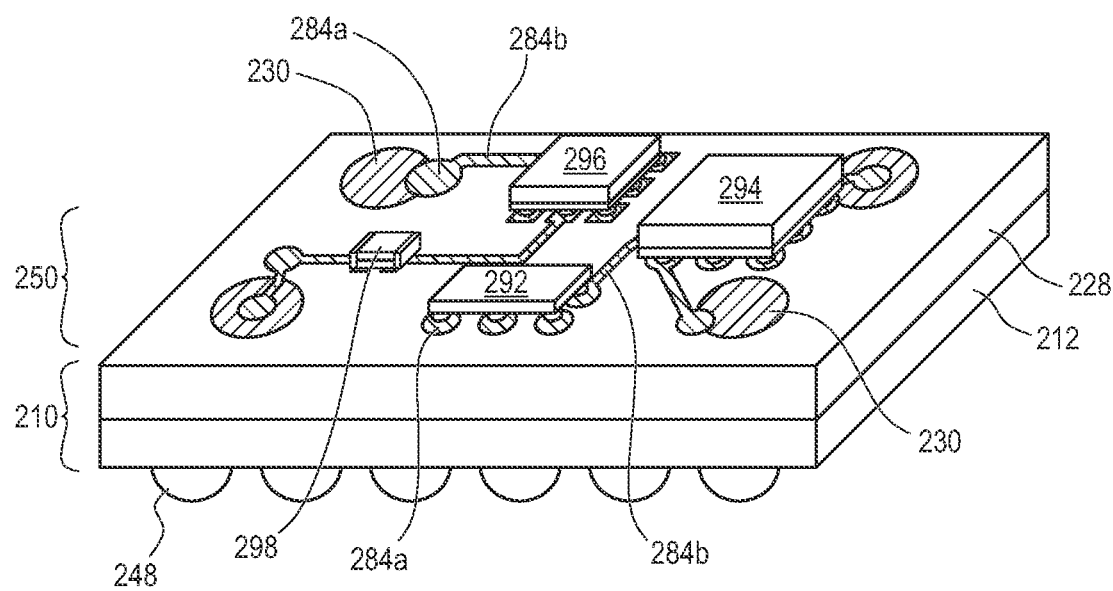

FIG. 2h shows semiconductor die 292, eWLB package 294, WLCSP 296, and discrete capacitor 298 mounted onto contact pads 284a. The mounted components are disposed over first layer 210 using any suitable process, such as with a pick-and-place machine. Solder bumps or paste reflowed between contact pads of the mounted components 292-298 and contact pads 284a provide both a mechanical and an electrical coupling. A mold underfill can be deposited between the components and first layer 210. Any desired electrical components can be mounted onto conductive pattern 284 as part of second layer 250. The components can be any discrete passive or active device, a bare die, a WLCSP, or a single or double-side molded SiP module. Any of the components optionally have their own shielding layers formed over or within the individual components in addition to shielding formed as part of package 200.

Figure 2I:
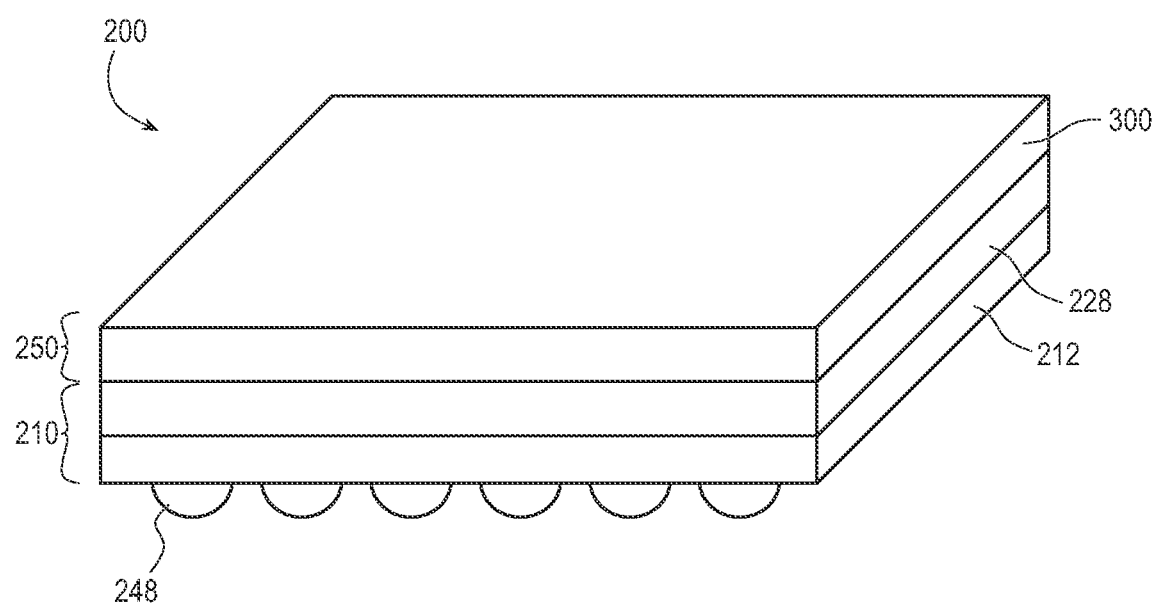

In FIG. 2i, encapsulant 300 is deposited over mounted components 292-298 to provide a package body for second layer 250. Encapsulant 300 is similar to encapsulant 228, i.e., deposited in a similar process and formed of a similar material. Encapsulant 300 completely covers the top surface of encapsulant 228 and conductive pattern 284, including all the components mounted thereto. To make more than two package layers, conductive vias can be formed through encapsulant 300 similar to conductive vias 230 through encapsulant 228. The manufacturing steps shown in FIGS. 2c-2i can be repeated indefinitely to create any suitable number of package layers.

Figure 2J:
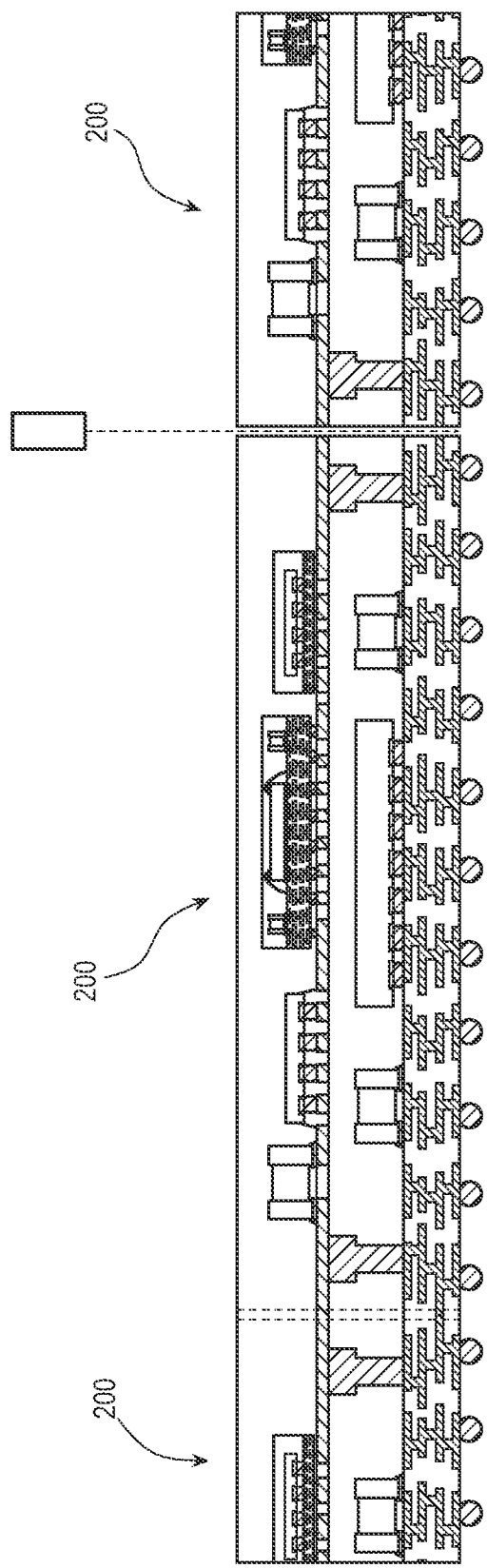

Once the desired number of layers is complete, the panel of packages 200 is singulated to separate the packages using a saw blade, laser cutting tool, water jet, or other suitable tool as shown in FIG. 2j. Singulation removes a certain width of material between each package 200 corresponding to the kerf of the saw being used. The removed material results in each package 200 having side surfaces 306 exposed. Side surfaces 306 comprise coplanar surfaces of substrate 212, encapsulant 228, and encapsulant 300. In some embodiments, conductive pattern 284 extends across the saw street and has an exposed surface coplanar with the others as part of side surfaces 306. Each package 200 is typically formed in a rectangular shape to have four total side surfaces 306. Other package shapes can be made in other embodiments.

Figure 2K:
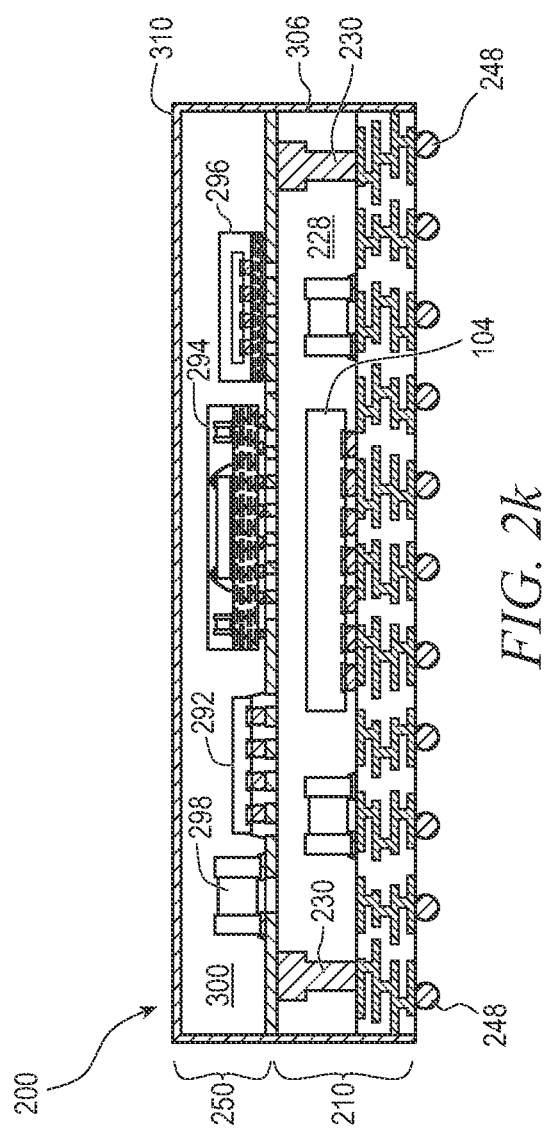
Figure 2L:
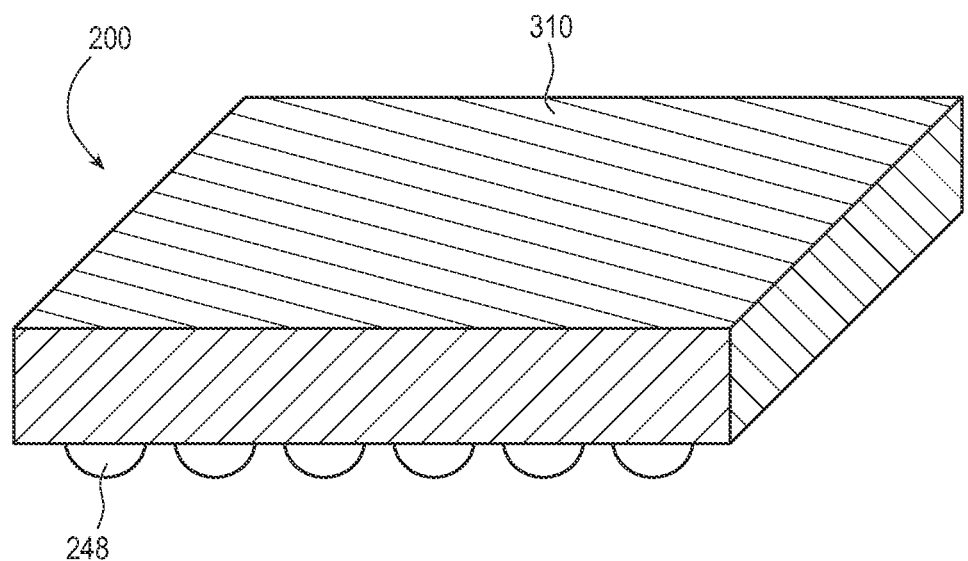

FIGS. 2k and 2l show packages 200 being completed by formation of a shielding layer 310 over the packages. Shielding layer 310 is formed by sputtering a conductive material over packages 200. Shielding layer 310 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable material. Shielding layer 310 completely covers side surfaces 306 as well as the top surface of encapsulant 300. Shielding layer 310 operates as an electromagnetic radiation shield to reduce interference.

Package 200 includes a variety of functions in a small package with high component density. Forming conductive pattern 284 using PSPI-based photolithography allows for improved patterning resolution without significant risk of damaging the underlying components of first layer 210. The patterning resolution and accuracy for PSPI layer 260 is high relative to the prior art, so smaller features can be made to accommodate a higher density of components. While the above PSPI patterning process is disclosed as being done over first package layer 210 as part of second package layer 250, the same process as illustrated above could be done to form an RDL on substrate 212 as part of the first package layer. Any RDL layer can be formed using the illustrated PSPI-based process.

Package 200 as shown in FIGS. 2k and 2l can be used in an electronic device. Bumps 248 can be reflowed onto contact pads of a PCB or other substrate to incorporate the functionality of package 200 into a larger system. Alternatively, package 200 can be used as a package-on-package (PoP) top package as shown in FIGS. 3a-3g.

Figure 3A:
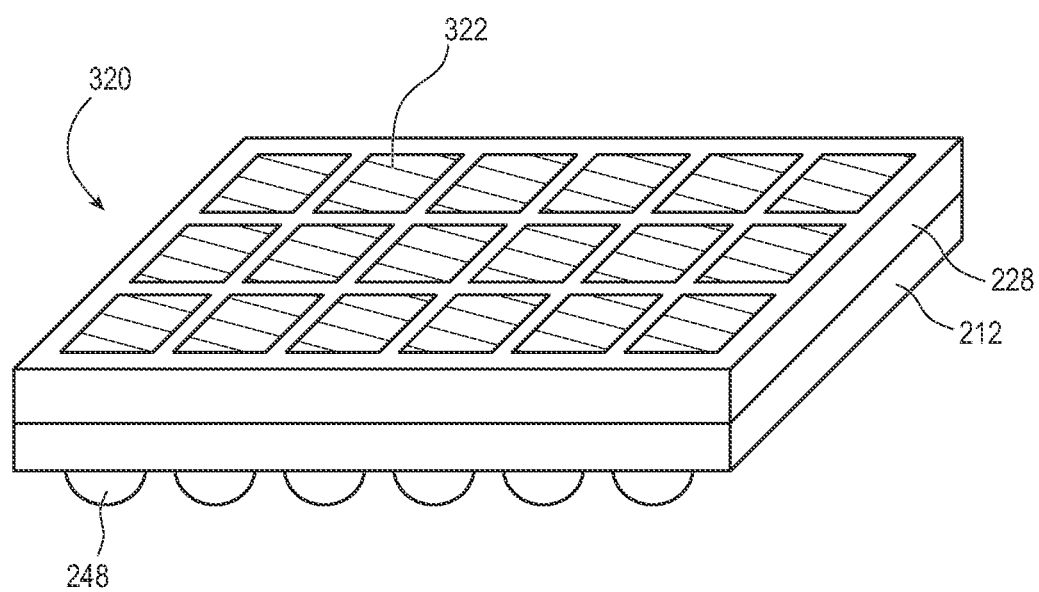
FIGS. 3a-3g illustrate forming a package-on-package using the photosensitive polyimide redistribution layer technique.

FIG. 3a shows a package-on-package bottom package 320. Bottom package 320 has a first layer 210 similar to top package 200, and also has contact pads 322 formed over the top surface of the first package layer. Conductive traces can also be formed along with the same conductive layer as contact pads 322. Contact pads 322 are connected to underlying semiconductor components by conductive vias 230. The layout of contact pads 322 is configured as necessary to mount top package 200 to the contact pads. Contact pads 322 and any necessary conductive traces are formed using the above-illustrated PSPI-based patterning process.

Figure 3B:
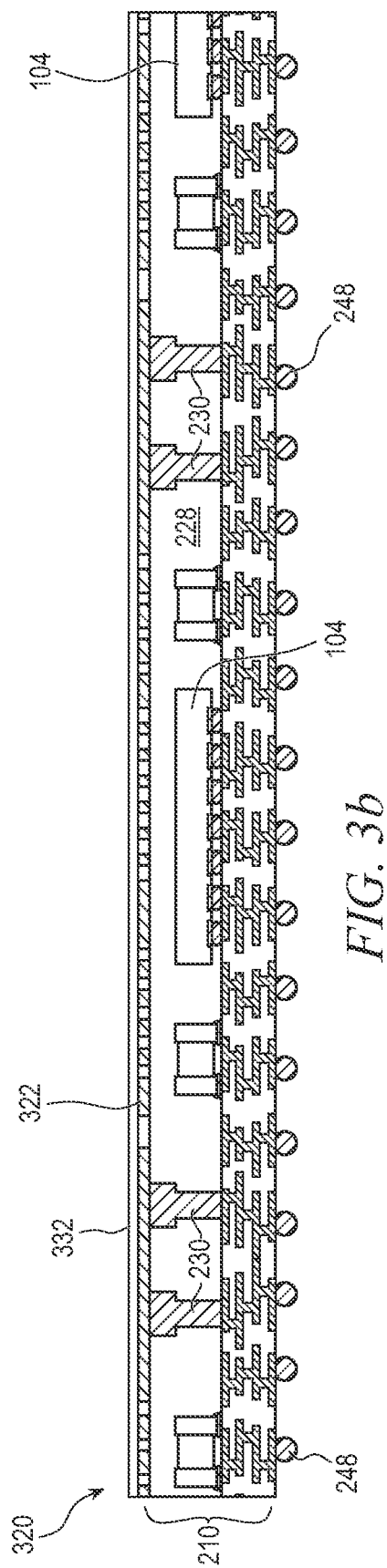
Figure 3C:
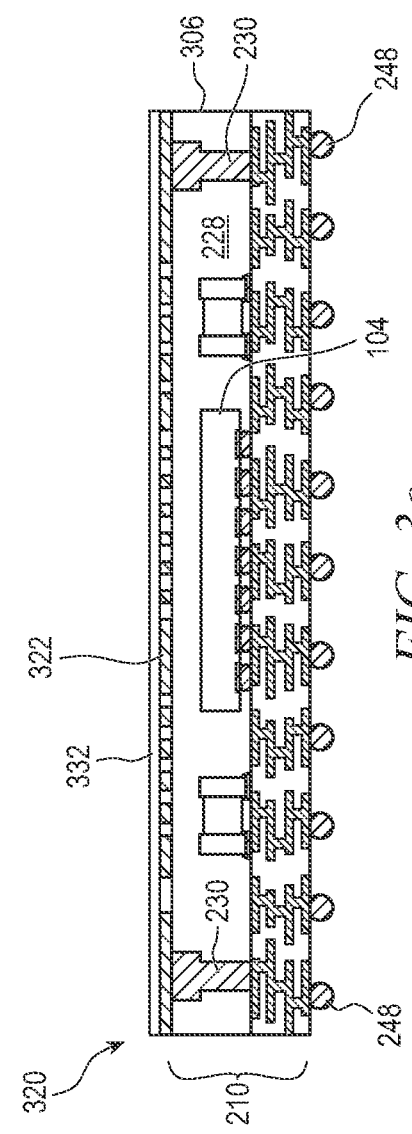

FIG. 3b shows a panel 330 of top packages 320. The top surface of encapsulant 228, conductive vias 230, and contact pads 322 is covered by a tape 332. Tape 332 is an adhesive tape stuck to first layer 210 using adhesive. In other embodiments, tape 332 is laminated onto first layer 210. FIG. 3c shows a bottom package 320 singulated from panel 330. Tape 332 remains covering the top surface of bottom packages 320, and singulation creates a gap between each adjacent bottom package. Side surfaces 306 are exposed by the singulation.

Figure 3D:
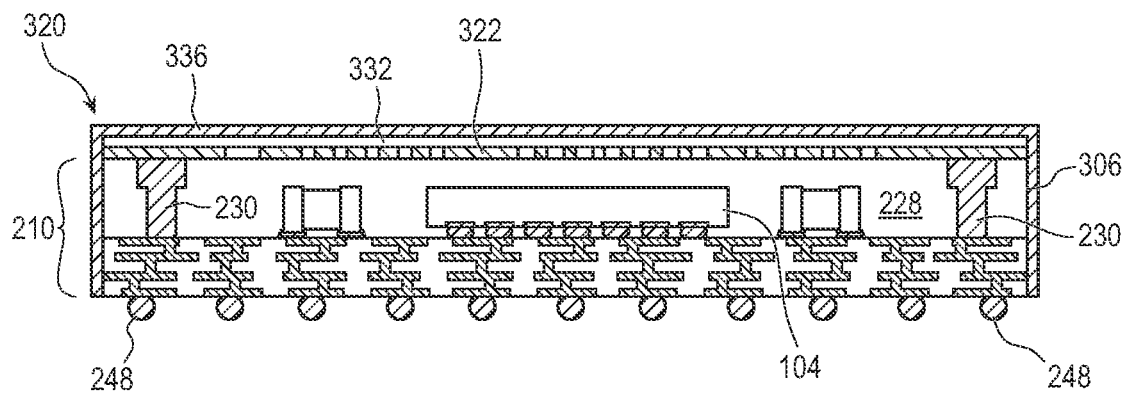

In FIG. 3d, a shielding layer 336 is formed over packages 320 with tape 332. Shielding layer 336 is formed using any suitable metal deposition technique, e.g., chemical vapor deposition, physical vapor deposition, other sputtering methods, spraying, or plating. The sputtered material can be copper, steel, aluminum, gold, combinations thereof, or any other suitable conductive material. Shielding layer 336 completely covers tape 332 as well as side surfaces 306 of each bottom package.

Figure 3E:
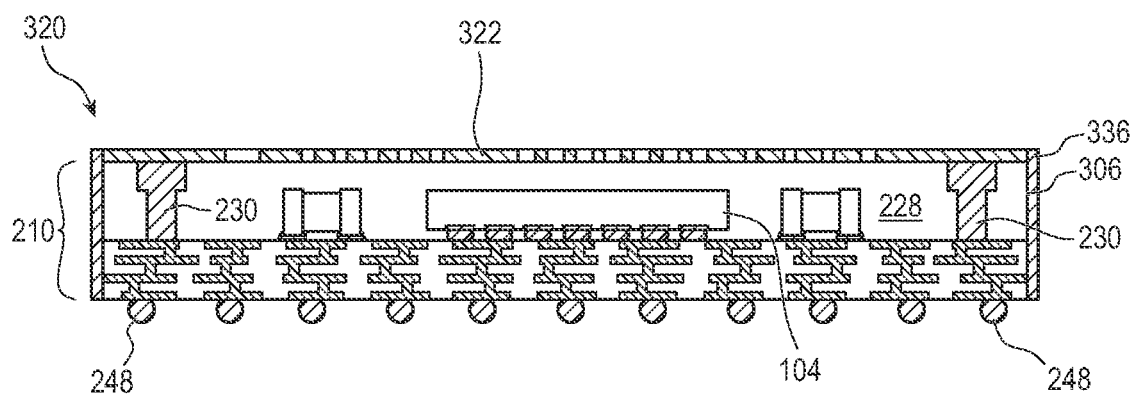

Tape 332 is removed in FIG. 3e. Removal of tape 332 also removes shielding layer 336 on the top of packages 320, thus exposing contact pads 322. Side surfaces 306 remain covered by shielding layer 336 because tape 332 was not disposed on the side surfaces.

Figure 3F:
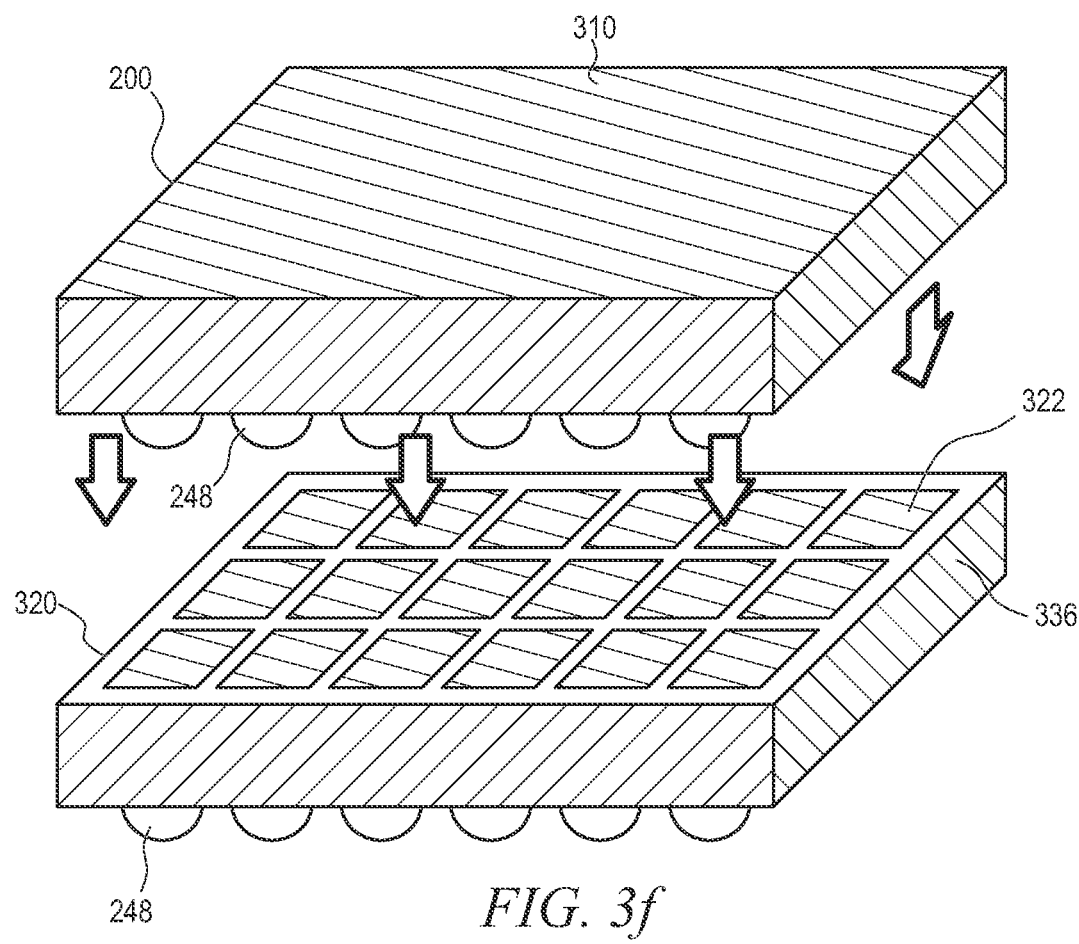
Figure 3G:
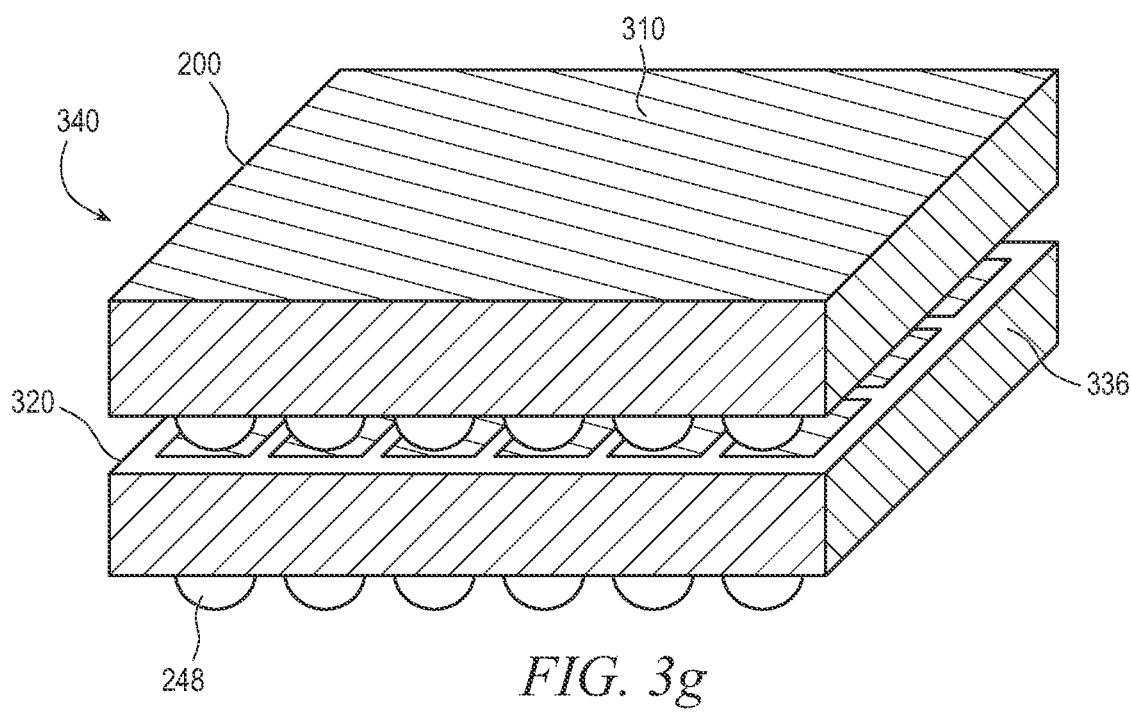

In FIG. 3f, top package 200 from FIGS. 2k and 2l is mounted onto contact pads 322 to form a PoP 340. FIG. 3g shows a completed PoP 340. Bumps 248 of top package 200 are reflowed to connect the top package to bottom package 320 mechanically and electrically. The components in top package 200 are electrically coupled to the components in bottom package 320 through bumps 248, contact pads 322, and conductive vias 230. Shielding layer 336 of bottom package 320 combines with shielding layer 310 of top package 200 to fully shield PoP 340. Bottom package 320 is protected by shielding layer 336 blocking EMI coming in from the side and by shielding layer 310 blocking EMI coming in from the top. Even though bottom package 320 does not have a shielding layer formed on the top surface of the bottom package, shielding layer 310 of top package 200 provides sufficient protection.

While bottom package 320 is shown as having only a single package layer 210, the bottom package could also have a second package layer 250 with contact pads 322 formed on the second package layer instead of the first. As with top package 200, bottom package 320 can be formed with any suitable number of package layers.

Figure 4:
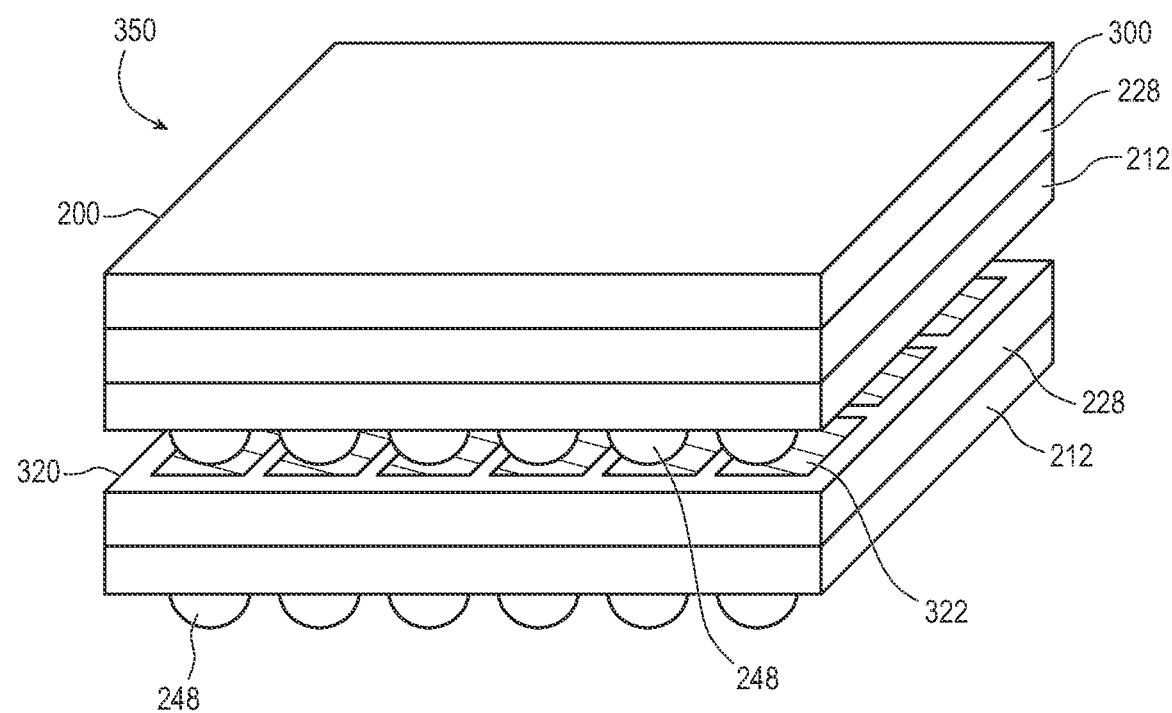
FIG. 4 illustrates another package-on-package embodiment.

FIG. 4 shows a PoP 350. PoP 350 is formed in the same manner as shown above in FIGS. 2a-2l and FIGS. 3a-3g except that shielding layers 310 and 336 are not formed. The manufacturing process for top package 200 stops after singulation in FIG. 2j. Shielding layer 310 is not formed as shown in FIGS. 2k and 2l. Bottom packages 320 are completed by singulating panel 330 in FIG. 3b without tape 332 and without forming shielding layer 336 as shown in FIGS.

3c-3e. Package-on-package assemblies can be made with shielding layer 310 and not shielding layer 336, or vice versa.

Figure 5:
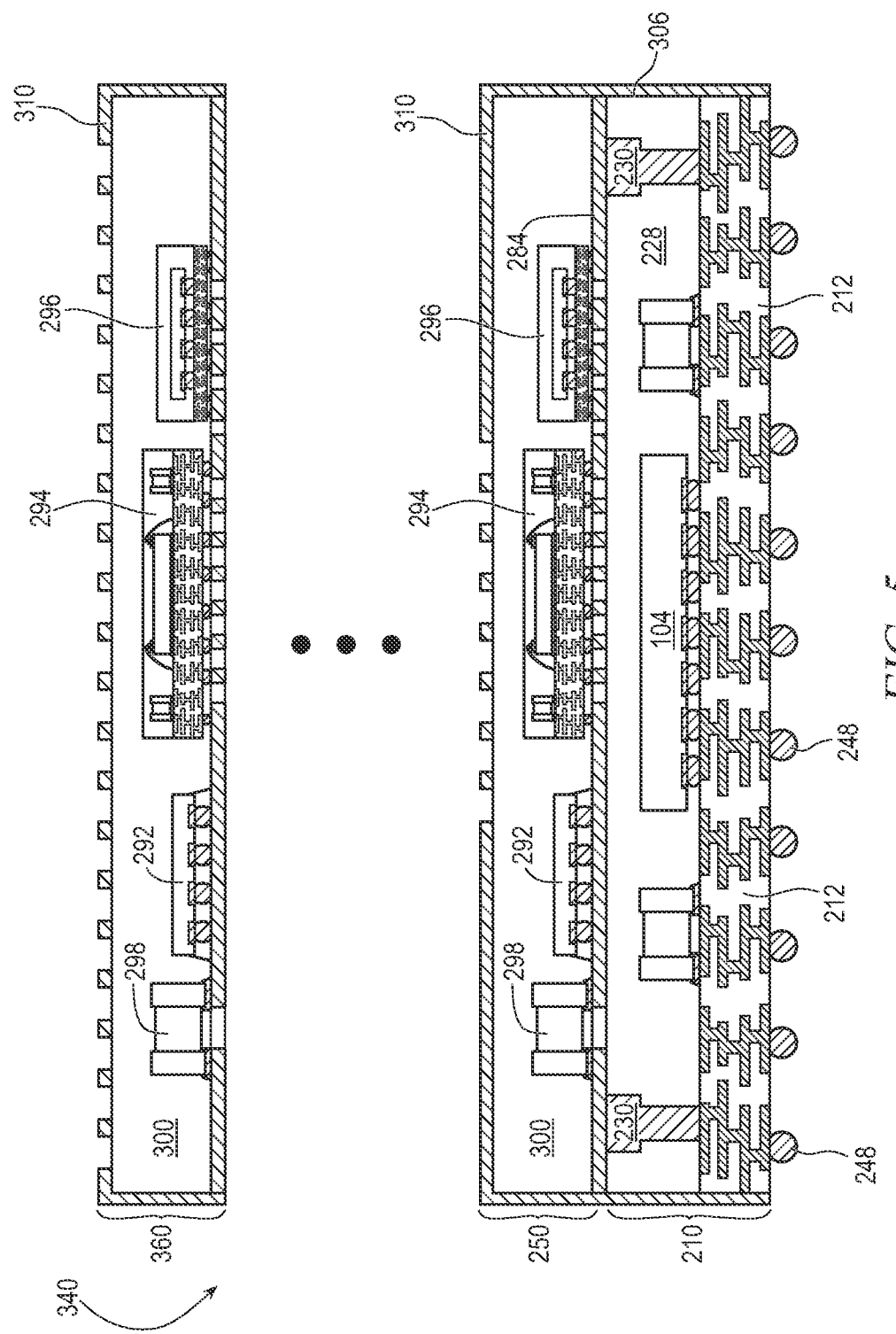
FIG. 5 illustrates successive formation of any number of package layers.

FIG. 5 shows stacking additional layers indefinitely to any suitable number of layers. While the embodiments above show only two layers 210 and 250, additional layers can continue being formed indefinitely for both top package 200 and bottom package 320. Conductive layers 284 are formed on top of each layer where an RDL is needed using the same PSPI patterning method disclosed above. The process of patterning, component mounting, molding or partial molding, and then metal deposition or EMI shielding can be repeated indefinitely until top layer 360 is formed after the desired number of intermediate package layers.

Figure 6A:
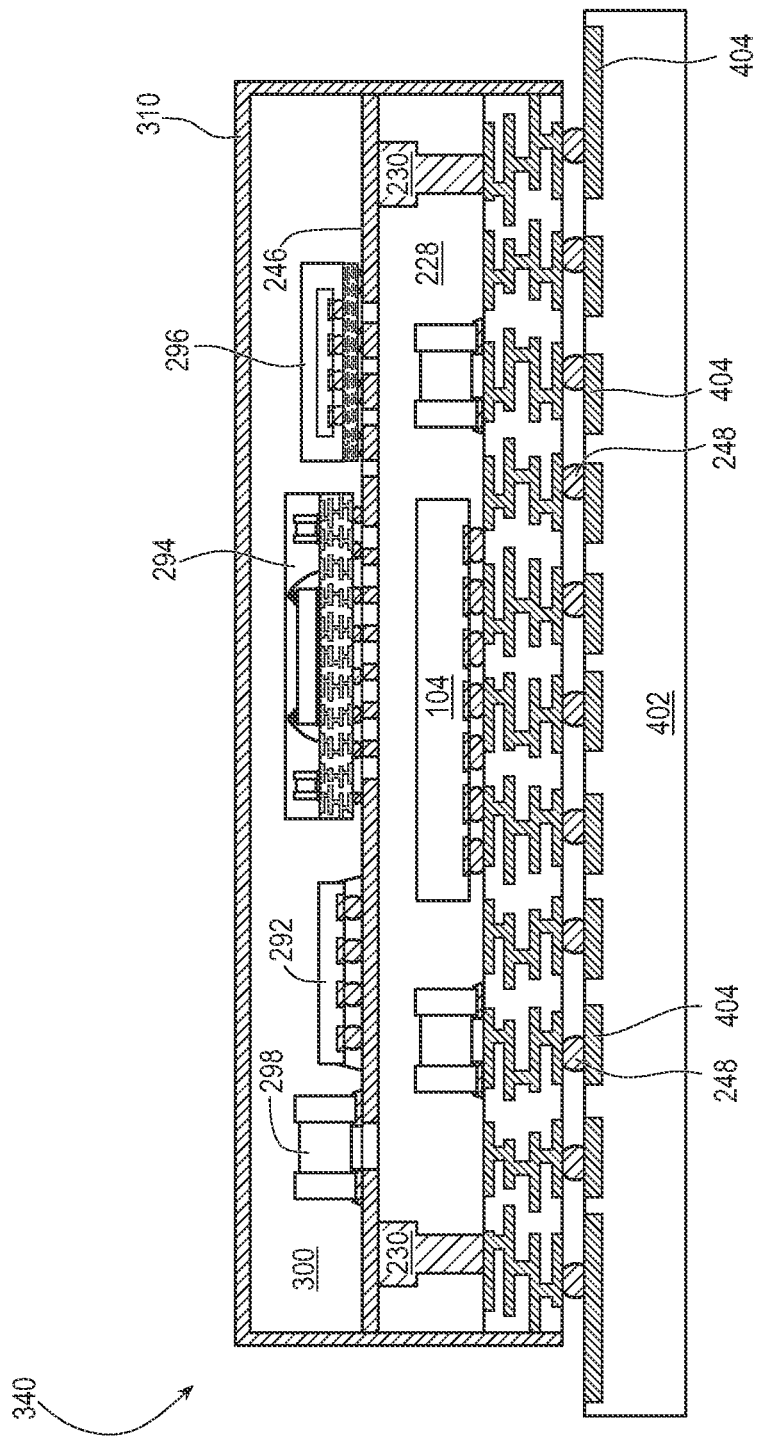
FIGS. 6a and 6b illustrate integrating the semiconductor packages into an electronic device.
Figure 6B:
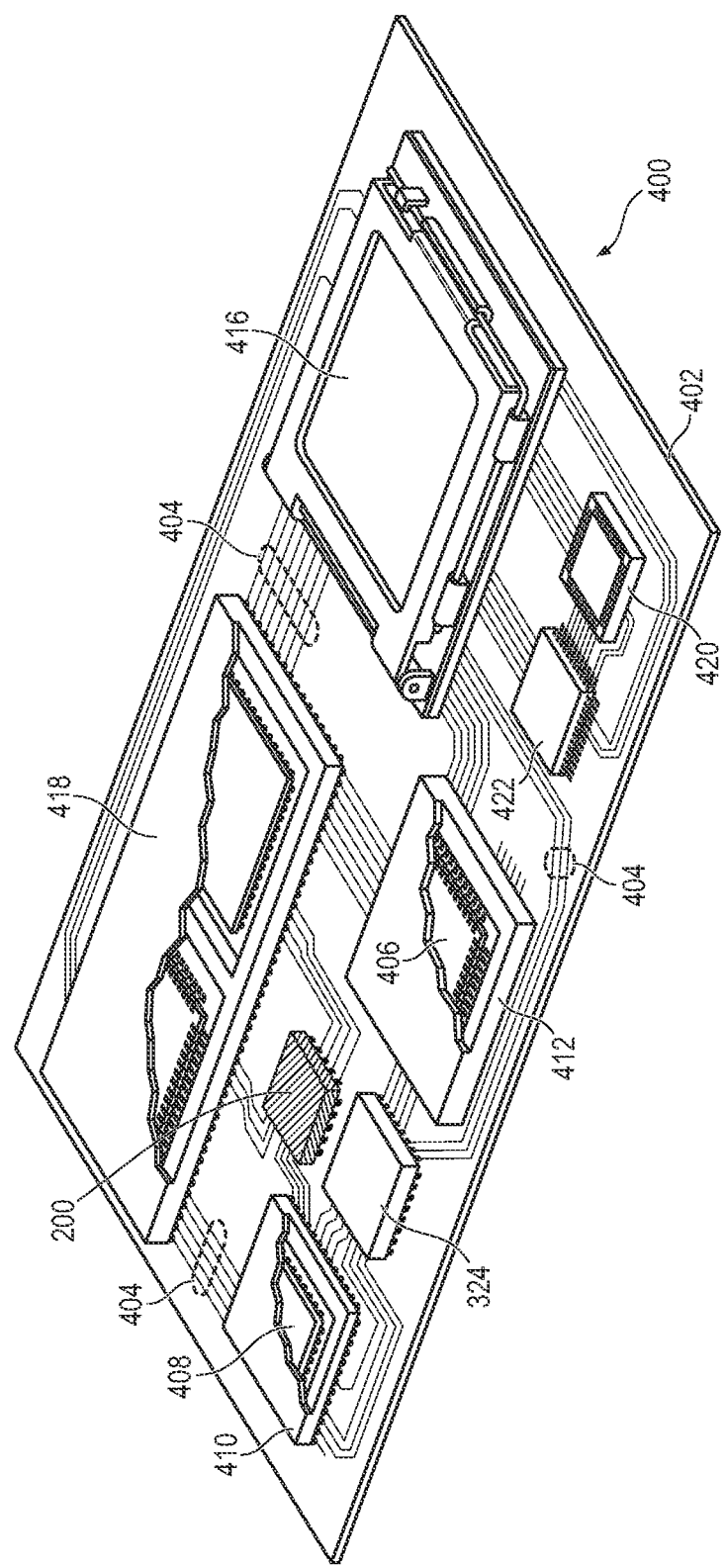

FIGS. 6a and 6b illustrate incorporating the above described packages, e.g., package 200 with shielding layer 310 formed over first layer 210 and second layer 250, into an electronic device 400. FIG. 6a illustrates a partial cross-section of package 200 mounted onto a printed circuit board (PCB) or other substrate 402 as part of electronic device 400. Bumps 248 are formed on conductive layer 216 on the bottom of substrate 212. Conductive bumps 248 can be formed at any stage of the manufacturing process, e.g., prior to molding encapsulant 228, prior to singulation, or after forming shielding layer 310. Bumps 248 are reflowed onto conductive layer 404 of PCB 402 to physically attach and electrically connect package 200 to the PCB. In other embodiments, thermocompression or other suitable attachment and connection methods are used. In some embodiments, an adhesive or underfill layer is used between package 200 and PCB 402. Semiconductor die 104 is electrically coupled to conductive layer 404 through substrate 212 and bumps 248.

FIG. 6b illustrates electronic device 400 with a plurality of semiconductor packages mounted on a surface of PCB 402, including package 200. Electronic device 400 can have one type of semiconductor package, or multiple types of semiconductor packages, depending on the application. Electronic device 400 can be a stand-alone system that uses the semiconductor packages to perform one or more electrical functions. Alternatively, electronic device 400 can be a subcomponent of a larger system. For example, electronic device 400 can be part of a tablet computer, cellular phone, digital camera, communication system, or other electronic device. Electronic device 400 can also be a graphics card, network interface card, or another signal processing card that is inserted into a computer. The semiconductor packages can include microprocessors, memories, ASICs, logic circuits, analog circuits, RF circuits, discrete active or passive devices, and other semiconductor die or electrical components.

In FIG. 6b, PCB 402 provides a general substrate for structural support and electrical interconnection of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between the semiconductor packages, mounted components, and other external systems or components. Traces 404 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 402. In other embodiments, a semiconductor device may only have the first level packaging where the die is mechanically and electrically mounted directly to PCB 402.

For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) 418, quad flat non-leaded package (QFN) 420, quad flat package 422, and eWLB 424 are shown mounted on PCB 402 along with package 200. Conductive traces 404 electrically couple the various packages and components disposed on PCB 402 to package 200, giving use of the components within package 200 to other components on the PCB.

Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed is:

1. A semiconductor device, comprising:
    a first semiconductor package layer including,
        a substrate,
        a first semiconductor die disposed over the substrate,
        a first encapsulant deposited over the substrate and first semiconductor die, and
        a redistribution layer (RDL) formed on the first encapsulant;
    a second semiconductor package layer including,
        a second semiconductor die mounted to the RDL, and
        a second encapsulant deposited over the second semiconductor die;
    a photosensitive polyimide (PSPI) layer formed directly on the second encapsulant, wherein the PSPI layer is patterned into an RDL pattern; and
    a conductive layer formed over the PSPI layer and into the RDL pattern.

2. The semiconductor device of claim 1, wherein the RDL physically contacts a conductive via of the first semiconductor package layer.

3. The semiconductor device of claim 1, further including a mask disposed over the second semiconductor package layer with the RDL pattern formed in the mask.

4. The semiconductor device of claim 3, further including a radiation source disposed over the mask.

5. The semiconductor device of claim 1, wherein the second semiconductor die is part of a semiconductor package.

6. The semiconductor device of claim 1, wherein the conductive layer extends onto a side surface of the first encapsulant and substrate.

7. A semiconductor device, comprising:
a semiconductor package layer including,
a substrate,
a semiconductor die disposed over the substrate, and
an encapsulant deposited over the substrate and semiconductor die;
a photosensitive polyimide (PSPI) layer formed directly on the encapsulant, wherein the PSPI layer is patterned into a redistribution layer (RDL) pattern;
a conductive layer formed over the PSPI layer and into the RDL pattern;
a mask disposed over the semiconductor package layer with the RDL pattern formed in the mask; and
a radiation source disposed over the mask.

8. The semiconductor device of claim 7, wherein the conductive layer physically contacts a conductive via of the semiconductor package layer within the RDL pattern.

9. The semiconductor device of claim 8, wherein the conductive layer is electrically coupled to the substrate through the conductive via.

10. The semiconductor device of claim 7, wherein the RDL pattern includes a plurality of contact pads.

11. The semiconductor device of claim 10, wherein the RDL pattern includes a conductive trace coupled between the plurality of contact pads.

12. A semiconductor device, comprising:
a first semiconductor package layer including a first electrical component;
a second semiconductor package layer including a second electrical component and formed over the first semiconductor package layer;
a photosensitive polyimide (PSPI) layer formed over the second semiconductor package layer, wherein the PSPI layer is patterned into a redistribution layer (RDL) pattern; and
a conductive layer formed over the PSPI layer and into the RDL pattern.

13. The semiconductor device of claim 12, wherein the conductive layer physically contacts a conductive via of the semiconductor package layer within the RDL pattern.

14. The semiconductor device of claim 12, further including a mask disposed over the semiconductor package layer with the RDL pattern formed in the mask.

15. The semiconductor device of claim 14, further including a radiation source disposed over the mask.

16. The semiconductor device of claim 12, wherein the semiconductor package layer includes a semiconductor die disposed under the RDL pattern.

17. The semiconductor device of claim 16, wherein the semiconductor package layer includes an encapsulant deposited over the semiconductor die with the PSPI layer formed on the encapsulant.

18. The semiconductor device of claim 12, wherein the first semiconductor package layer is formed on a substrate.

19. A semiconductor device, comprising:
a semiconductor package layer;
a photosensitive polyimide (PSPI) layer formed over the semiconductor package layer, wherein a redistribution layer (RDL) pattern is formed in the PSPI layer;
a mask disposed over the semiconductor package layer with the RDL pattern formed in the mask; and
a radiation source disposed over the mask.

20. The semiconductor device of claim 19, further including a conductive layer formed over the PSPI layer and extending into the RDL pattern.

21. The semiconductor device of claim 20, wherein the conductive layer physically contacts a conductive via of the semiconductor package layer within the RDL pattern.

* * * * *